United States Patent

[11] 3,571,743

[72] Inventor Elchanan Dove Menkes
Westmont, N.J.
[21] Appl. No. 771,884
[22] Filed Oct. 30, 1968
[45] Patented Mar. 23, 1971
[73] Assignee RCA Corporation

[54] PHASE LOCK LOOP
14 Claims, 6 Drawing Figs.

[52] U.S. Cl. .......... 331/11, 331/1
[51] Int. Cl. .......... H03b 3/06
[50] Field of Search .......... 331/10, 11, 12, 1

[56] References Cited

UNITED STATES PATENTS 3,336,534 8/1967 Gluth .......... 331/12
3,358,240 12/1967 McKay .......... 331/12

*Primary Examiner*—John Kominski
*Attorney*—Edward J. Norton

ABSTRACT: In a frequency synthesizer, multiple signals having the same reference frequency, but a different phase, are provided. Each one of the reference signals is used to correct the frequency of the VCO at a different time during the time interval necessary for one cycle of the reference signal to occur, thereby increasing the number of corrections without increasing the reference frequency of correction.

INVENTOR
ELCHANAN D. MENKES

BY Edward J. Norton
ATTORNEY

INVENTOR
ELCHANAN D. MENKES

BY Edward J. Norton
ATTORNEY

INVENTOR
ELCHANAN D. MENKES

BY Edward J. Naton
ATTORNEY

PHASE LOCK LOOP

This invention relates to frequency synthesis, and, more particularly, an improved phase lock loop circuit in which the frequency is corrected more often without increasing the channel spacing of the system.

There are two basic approaches to indirect frequency correction. In one approach the output of a voltage controlled oscillator VCO is sampled at various intervals. If these intervals are an exact multiple of the frequency of the VCO signal, there will be no change in the magnitude of the average sampled value. However, where the frequency of the VCO output signal changes by a slight amount between samples, a change in the sampled magnitude results and is detected. An error voltage, which is a voltage having a magnitude proportional to this change in magnitude, is then applied to the VCO to correct for the frequency variation. In other words, the frequency of the VCO signal can only lock in or be stable at an exact multiple of the sampling frequency. Thus, the channel spacing of the VCO is limited to integral multiples of the sampling frequency. Where the channel spacing is close together and there may be many channels the duration between samples is relatively long. In this situation, there is a likelihood that the VCO may drift so much between samples that the error detected by adjacent samples is too great to be corrected at a sufficiently rapid rate. Thus the sampling frequency will have to be increased at the expense of a reduction in the number of available output frequencies. Another common problem is that where high frequency samples are acceptable, inexpensive microelectronic integrated circuits will not operate at the high frequency.

In the second approach, the output signal of the VCO is applied to a frequency divider which produces a chain of pulses at a submultiple of the VCO signal frequency. When the VCO is locked at a proper frequency, the frequency of the divided VCO signal is the same as the frequency of a chain of pulses occurring at a reference frequency. If the frequency of the VCO drifts the phase and frequency of the divided chain changes with respect to the reference phase and frequency. This change is detected in a phase comparator and an error signal is produced which is proportional to the change. The error signal is applied to the VCO and returns it to the proper locked frequency. Here again, the VCO will lock in at the frequency which is the product of the reference frequency times the divisor of the frequency divider. Thus, the larger the reference frequency, the larger the channel spacing or the smaller the number of obtainable stable frequencies from the VCO. As is usually the case, the VCO signal is first frequency divided by a fixed amount, e.g. 500, before being applied to the frequency divider so therefore the channel spacing would be the frequency of the reference signal applied to the phase comparator, e.g. 100 Hz. times the fixed divider, 500, or 50 kHz. However, it is desirous to have a higher correction frequency, and in some applications, a higher channel spacing.

It is an object of this invention to provide a phase locked loop circuit in which the rate of frequency correction is increased but not at the expense of reducing the number of available frequencies.

This object is realized by providing a frequency dividing circuit with a plurality of outputs between a reference frequency oscillator output and the input to the error voltage producing means such that a divided signal of the frequency which determines the channel spacing of the VCO appears on each output, each signal having a different phase and producing an error voltage with respect to the phase of each of the divided signals.

Specific embodiments of the invention are hereinafter described in connection with the following FIGS. in which.

Figure 1:
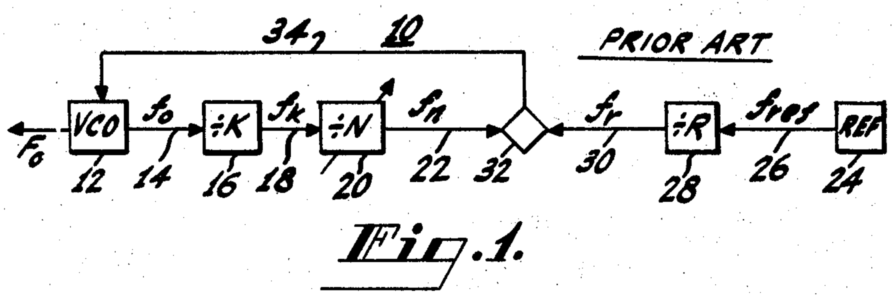
FIGS. 1 and 2 represent state of the art frequency synthesizing approaches.

Referring to FIG. 1, a digital frequency synthesizer 10, known in the art, is shown. Synthesizer 10 includes VCO 12 which is a typical voltage control oscillator having an output signal $F_o$ of frequency $f_o$. The output $F_o$ of the VCO is transformed into a chain of pulses of frequency $f_o$ and applied through line 14 to a fixed K frequency dividing network 16 whose output is a chain of pulses of frequency $f_o/k$ or $f_k$. The output signal $F_k$ of the K network 16 is applied through line 18 to variable N frequency dividing network 20 which divides the frequency $f_k$ by N such that the output is a signal $F_n$ with frequency $f_n$ on line 22. External reference oscillator 24 provides a reference signal $F_{ref}$ of reference frequency $f_{ref}$ on line 26 which is applied to a fixed R frequency dividing network 28. The output of network 28 is a signal $F_r$ having frequency $f_r$ on line 30.

The signals on both lines 22 and 30 are applied to phase comparator 32 which detects any difference in the frequency and phase of $F_n$ and $F_r$. If VCO 12 is oscillating at frequency $f_o$, the phase and frequency of signal $F_n$ will be the same as signal $F_r$. If the frequency of $F_o$ changes, the frequency of $F_n$ will change causing a frequency difference in the pulses of signals $F_n$ and $F_r$. This difference is translated into a DC signal and applied through line 34 back to the VCO to change the frequency $f_o$ to such an extent that the frequency of signal $F_n$ is again equal to the frequency and phase of signal $F_r$. If the divisor of variable N frequency dividing network 20 is changed, frequency $f_n$ will change and an error signal will appear on line 34 until VCO 12 locks at a new frequency $f_o$ such that $f_n$ equals $f_r$.

Figure 2:
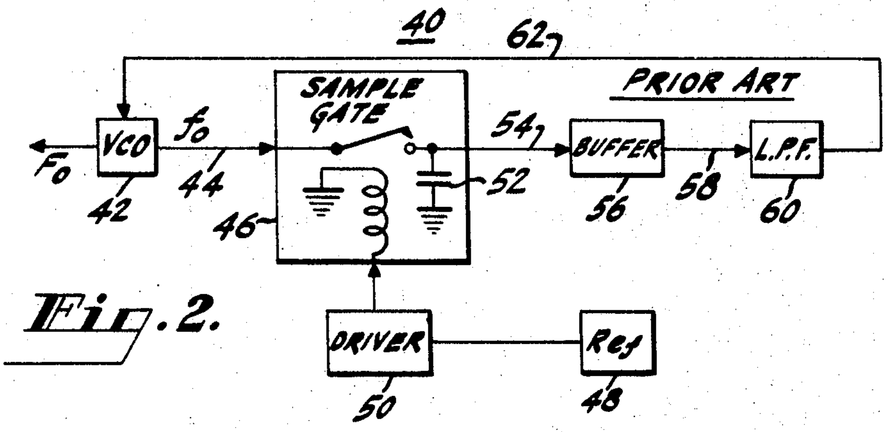

Referring to FIG. 2 a second type of frequency synthesizing system 40 is shown. In this system VCO 42 oscillates at an assumed frequency $f_o$ and applies a signal $F_o$ having a frequency of $f_o$ to line 44. Signal $F_o$ is applied to a sample gate 46 which samples its magnitude at a frequency $f_r$ which is an exact submultiple of $f_o$. Sampling gate 46 is controlled by an external reference oscillator 48 and driver 50 which apply a signal $F_r$ having a frequency $f_r$ to gate 46. Capacitor 52 is charged to the magnitude of signal $F_o$ at the sample time, and if the frequency $f_o$ remains constant at an exact multiple of $f_r$, the average voltage across capacitor 52 remains constant. However, if the frequency of $F_o$ changes, the voltage across capacitor 44 will correspondingly change.

A signal $V_c$ representing the voltage across capacitor 52 is applied through line 54, to buffer circuit 56. Signal $V_c$ is applied through line 58 through low pass filter 60, and through line 62 back to VCO 42 to maintain it in phase lock. If a different frequency is desired, VCO 42 may be changed to oscillate at a different $f_o$ which however still must be an exact multiple of frequency $f_r$.

In the circuits shown by FIGS. 1 and 2 the channel spacing, or frequency difference between stable frequencies, of the VCO is dependent upon $f_r$. It is desirable to have as many frequencies as possible available, which results in a correspondingly lower reference frequency $f_r$. However, $f_r$ must still be high enough so that sufficient comparison can be made by phase comparator 32, or sample gate 46 to insure a proper frequency at all times. Furthermore, $f_r$ must not be so high, that inexpensive microelectronic integrated circuits can not be used.

Figure 3:
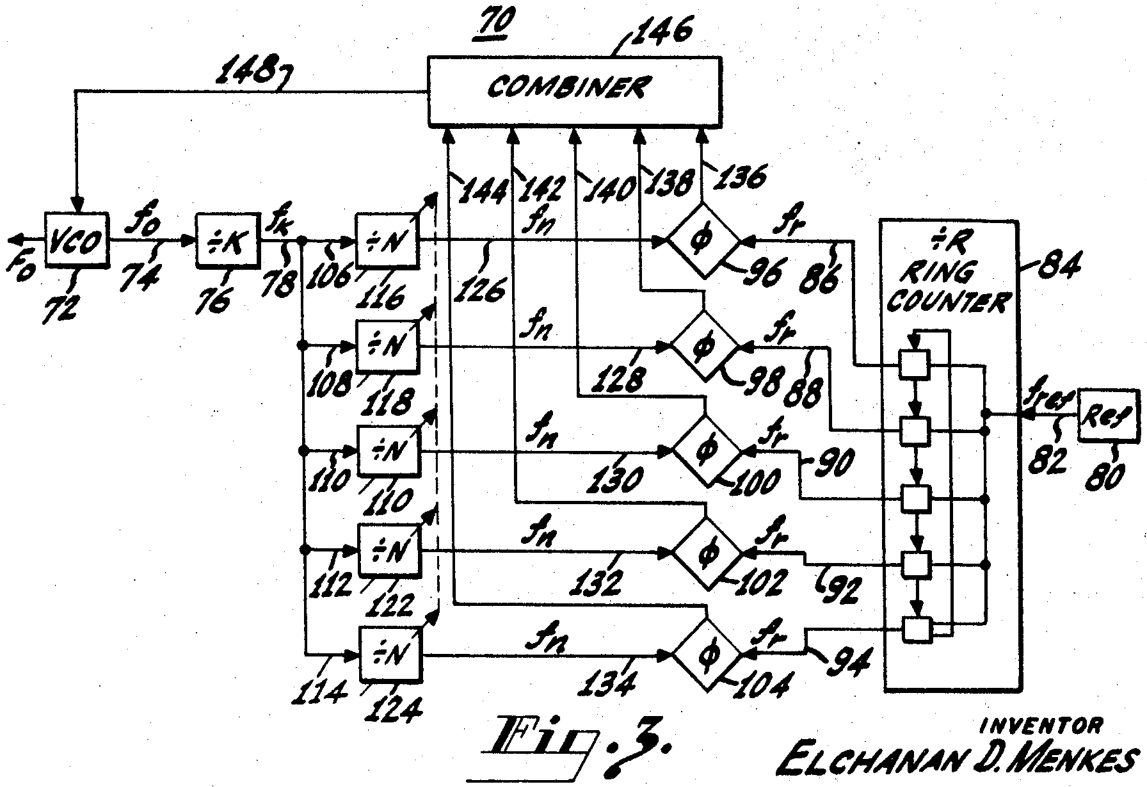
FIG. 3 is a circuit incorporating the invention for the FIG. 1 approach.

Referring now to FIG. 3, a system 70 using the approach of system 10, as shown by FIG. 1, with the addition of this invention, is shown. System 70 includes VCO 72 which provides a signal $F_o$ of frequency $f_o$ to line 74. Signal $F_o$ is frequency divided by fixed K frequency dividing network 76 and a signal $F_k$ consisting of a chain of pulses of frequency $f_k$ is applied to line 78. System 70 also includes a reference oscillator 80 which provides a reference signal $F_{ref}$ of frequency $f_{ref}$ to line 82. Signal $F_{ref}$ is applied to R ring counter 84 which has multiple outputs connected to lines 86—94. Signals $F_r$, each consisting of a chain of pulses of frequency $f_r$, appear on the lines 86—94; however, due to the design of ring counter 84, the phase of each of the signals $F_r$ is different. Each of the $F_r$ signals is applied through a respective line 86—94 to a respective first input to phase comparator 96–104.

The output signal $F_k$ of the K network 76 is applied through respective lines 106—114 to a one of several variable N frequency dividing networks, 116—124. Each of these networks divides the frequency of $F_k$ by N such that signals $F_n$, which are chains of pulses of frequency $f_n$, are applied through respective lines 126—134 to a second input of one of the respective phase comparators 96—104.

Each of the phase comparators 96—104 compares the time of occurrence of each pulse of the respective $F_r$ and $F_n$ signals applied to it. If there is a frequency difference between $f_n$ and $f_r$ an error signal is applied through respective lines 136—144 to combiner 146. Combiner 146 may be a simple adding circuit to which each error signal produced at the output of each of the phase comparators 96—104 is applied and which applies a total error signal through line 148 to correct VCO 72.

When the loop is phase locked at a stable frequency, $f_o$, of VCO 72, the frequency of the $F_r$ and $F_n$ signal applied to any given one of phase comparators 96—104 will be the same, although the phase at each individual phase comparator differs from the phase at any other one. Each of the phase comparators 96—104 will produce an error signal at the time a pulse of the respective $F_n$ and $F_r$ signals occurs; since the phases of each of these signals is different, each phase comparator 96—104 produces its error signal at a different time. Thus the signal $F_o$ is corrected more than once in the time required for one cycle of frequency $f_r$. But since the frequency $f_r$ remains the same the channel spacing of VCO 72 is not increased.

The operation of the circuit shown in FIG. 3 is more easily understood when reference is made to the timing diagram shown in FIGS. 4*a—n*. In FIG. 4*a* each vertical line represents a pulse in signal $F_k$ appearing on line 78. FIG. 4*b* represents the reference frequency which is assumed to be one-fourth of frequency $f_k$ in this example. If we assume that each of the N networks 116—124 is a 20 system, the signal $F_n$ on respective lines 126—134 is shown in FIGS. 4*c*, 4*e*, 4*g*, 4*i*, and 4*k*, assuming the loop is phase locked at frequency $f_o$. If the R ring counter 84 divides the reference frequency by 10, the $F_r$ signal on each of the five respective lines 86—94 is shown by respective FIGS. 4*d*, 4*f*, 4*h*, 4*j*, and 4*m*.

Figure 4:
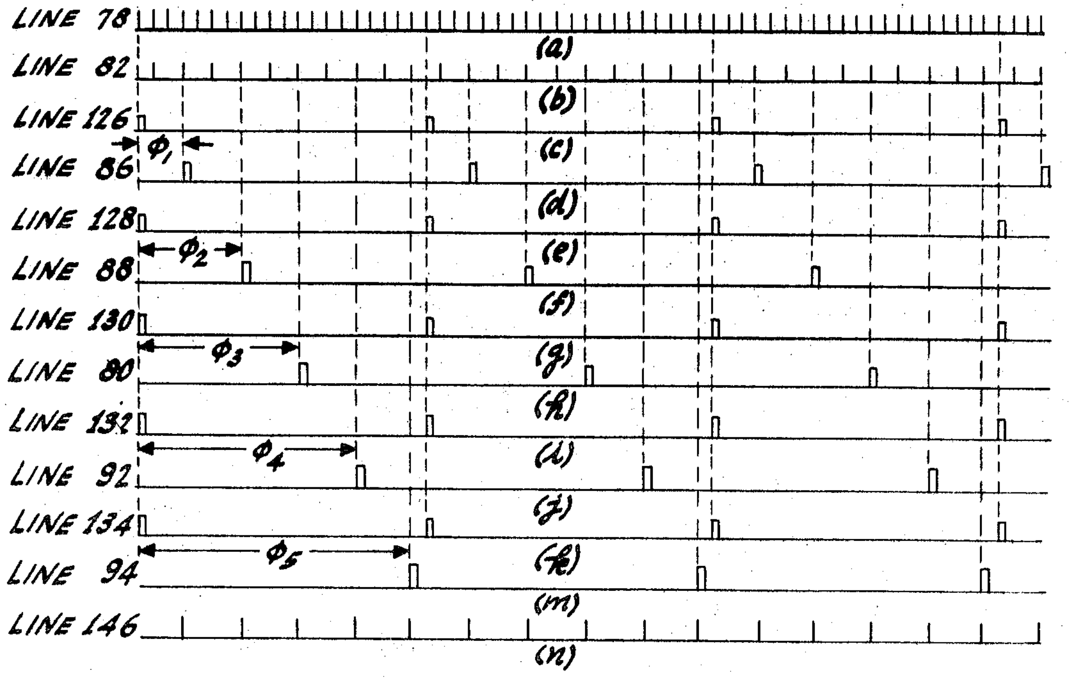
FIG. 4 is a timing chart showing the operation of FIG. 3.

The signals shown by FIGS. 4*c* and 4*d* are applied to phase comparator 96; the signals shown by FIGS. 4*e* and 4*f* are applied to phase comparator 98 and so forth. Once the system has become locked, any frequency difference in the signals in FIGS. 4*c* and 4*d* is detected by phase comparator 96 and an error voltage corresponding to the frequency difference is sent over line 136 and into combiner 146. The error voltage is applied to line 136 from phase comparator 96 when the phase difference between the signals on lines 126 and 86 does not remain constant for adjacent comparisons. This phase difference is represented in FIG. 4 by 101 , and it changes only when the frequency of $f_n$ is not equal to $f_r$. This error voltage passes through combiner 146 to line 148 and corrects the frequency of VCO 72. The same analysis may be repeated for each of the remaining phase comparators 98—104 so that a correction is made on VCO 72 every time a vertical line appears in FIG. 4N.

From FIG. 4 it can be seen that although the frequency of the signals applied to the phase comparators 96—104 is $f_r$, in actuality signal $F_o$ is being corrected at five times that rate because of the different phases of each of the five outputs of counter 84. Still the channel spacing of VCO 92 is only dependent upon $f_r$ or one-fifth of the actual error signal occurrence rate.

Figure 5:
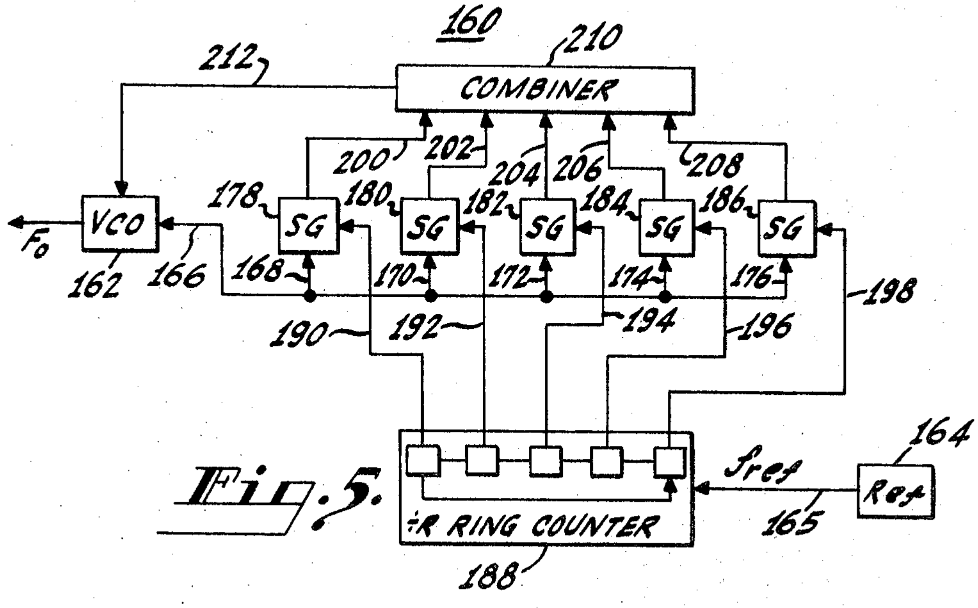
FIG. 5 is a circuit incorporating the invention for the FIG. 2 approach.

Referring now to FIG. 5, a system 160 using the approach of FIG. 2, but incorporating the teachings of this invention, is shown. This system includes VCO 162 the output of which is a signal $F_o$ with a frequency $f_o$ and external reference oscillator 164 with an output signal $F_{ref}$ having a frequency $f_{ref}$. The output of VCO 162 is applied through line 166 and lines 168—176 to each of five sampling gates 178—186 which are similar to the sampling gate 46 shown in FIG. 2. The reference signal $F_{ref}$ is applied to a ÷R ring counter 188 which has five outputs 190—198. A signal $F_r$ having a frequency $f_r$ is provided at each of the outputs 190—198 of counter 188; however, the phase of each of these signals is different. The signal on line 190 is applied to sampling gate 178 and this gate samples signal $F_o$ every time a pulse occurs on line 190. Similarly lines 192—198 are applied to respective sampling gate 180—186 and control the rate and time in which gates 180—186 sample $F_o$. The output of each of the sample gates 178—186 is applied over respective lines 200—208 to buffer and combiner 210 which combines the signal into a single total error signal and which applies this signal over line 212 to correct VCO 162.

Figure 6:
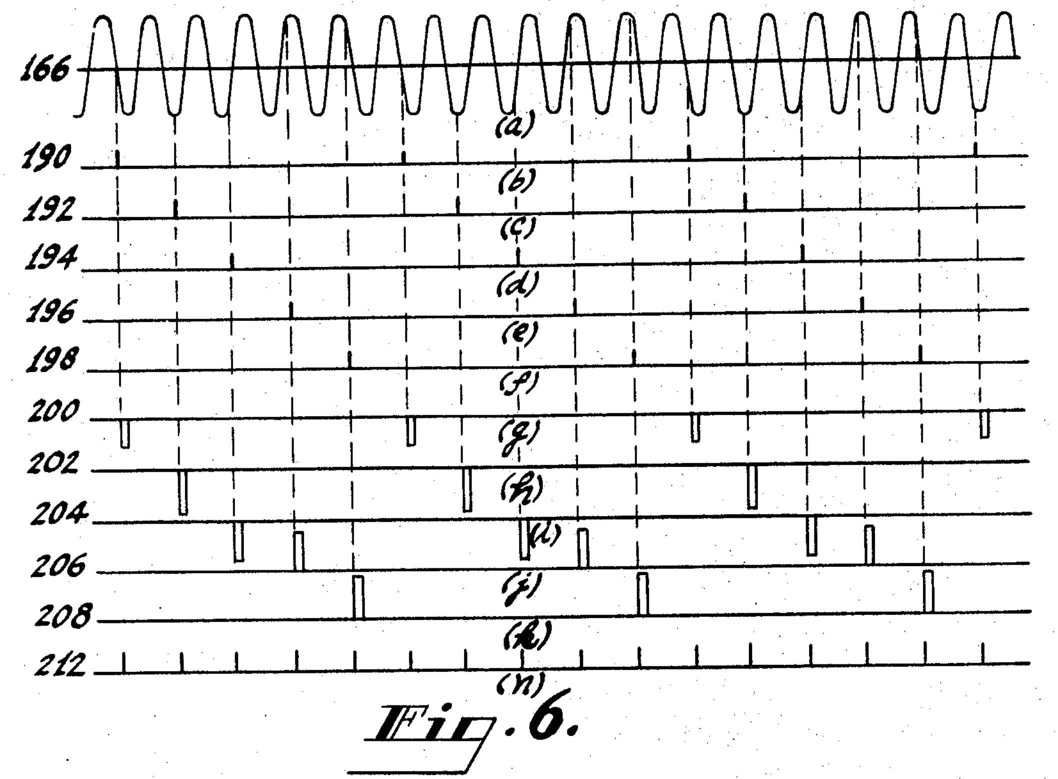
FIG. 6 is a timing chart showing the operation of the circuit shown by FIG. 5.

Reference is made to FIG. 6 in order to better understand the operation of the circuit shown in FIG. 5. FIG. 6*a*is a sine wave signal $F_o$ of frequency $f_o$. FIGS. 6*b—f*represent the time and frequency of the $F_r$ pulse signals appearing on lines 190-—198. FIGS. 6*g—k* represent the magnitudes of the sample $F_o$ which appears on respective lines 200—208 at the respective times shown by FIGS. 6*b—f*. FIG. 6*m* shows the total number of times signal $F_o$ is sampled, and represents each error signal on line 212.

The frequency $f_r$ of each of the $F_r$ signals is one-sixth that of $F_o$ or, in other words, the frequency $f_o$ is an exact multiple, 6, of the frequency $f_r$. However as seen in FIG. 6*m* the effective sampling rate of $F_o$ has been increased five fold due to the difference in phase of each of the $F_r$ signals as shown by FIGS. 6*b*—6*f* shown in Fig. 6*m* is five-sixths of the frequency $f_o$, or not an exact submultiple of $f_o$. However, the system still operates due to the fact that each of the $F_r$ signals on lines 190—198 have frequencies which are exact multiples of $f_o$.

I claim:

1. A phase lock loop comprising:

a controlled oscillator for producing a desired signal having a certain frequency, said certain frequency being under the control of a total error signal applied to an input of said oscillator;

a reference oscillator for producing a reference signal having a reference frequency;

a reference signal dividing network to which said reference signal is applied, said network having at least two network outputs, wherein one of at least two divided signals, each having a frequency which is a submultiple of said reference frequency, appears at each of said network outputs, at least two of said divided signals having different phases;

at least two error signal producing means, each one corresponding to one of said divided signals, each for producing an error signal in response to said desired signal which is applied to a first input thereof and said corresponding divided signal which is applied to a second input thereof; and combining means to which each of said error signals is applied for producing said total error signal in response to all of said error signals.

2. The invention according to claim 1 wherein said certain frequency deviates from a desired frequency and each of said error signals is changed by an amount proportional to said frequency deviation at the time it occurs.

3. The invention according to claim 2 wherein each of said error signal producing means changes said error signals by an amount proportional to said frequency deviation during a specific time, said specific time being dependent upon the phase of the corresponding divided signal applied to said means, at least two of said specific times being different.

4. A phase lock loop comprising:

a voltage controlled oscillator having an input to which a total error signal is applied and an output at which appears an output signal having a certain frequency, said certain frequency being different than a desired frequency by delta frequency, said total error signal compensating said oscillator so that said certain frequency approaches said desired frequency;

a reference oscillator for producing, at an output thereof, a reference signal having a reference frequency;

a reference signal dividing network having an input, a first output, and a second output; said input being coupled to said output of said reference oscillator; said network providing a first divided signal at said first output thereof and a second divided signal at said second output thereof, said first and second divided signals having the same divided frequency, said divided frequency being a submultiple of said reference frequency, and said first divided signal having a different phase than said second divided signal;

first error signal producing means having a first input, a second input, and an output; said first input being coupled to said output of said voltage controlled oscillator; said second input being coupled to said first output of said dividing network; said means providing, in response to the signals applied to said inputs thereof, a first error signal at said output thereof, said first error signal being corrected by an amount proportional to said delta frequency, during a first time that is determined by the phase of said first divided signal;

second error signal producing means having a first input, a second input, and an output; said first input being coupled to said output of said voltage controlled oscillator; said second input being coupled to said second output of said dividing network; said means providing, in response to the signals applied to said inputs thereof, a second error signal at said output thereof, said second error signal being corrected by an amount proportional to said delta frequency during a second time that is determined by the phase of said second divided signal, said second time interval differing from said first time interval; and combining means for combining said first and second error signals into said total error signal.

5. The invention according to claim 4 wherein said respective first error signal producing means and said second error signal producing means each include:

a second frequency dividing network to which said output signal is applied, for producing, at an output thereof, a third divided signal having a second divided frequency, which is a submultiple of said certain frequency; and a phase comparing means to which is applied said third divided signal and the respective one of said first and second divided signals for providing at an output thereof, in response to said signals applied thereto, said error signal of one of said respective error signal producing means.

6. The invention according to claim 5:

wherein said signals applied to each of said phase comparing means have the same frequency only when delta frequency is zero; and wherein said signals applied to each of said phase comparing means have a different frequency when said delta frequency is nonzero, and said error signals are only changed when said frequencies of said signals applied to said respective phase comparing means are different.

7. The invention according to claim 4 wherein each one of said first error signal producing means and said second error signal producing means include a sampling gate to which said output signal and said respective divided signal are applied, said sampling gate applying said error signal produced by said one respective error signal producing means to an output thereof.

8. The invention according to claim 7:

wherein said sampling gate samples said output signal applied thereto at a rate equivalent to said divided frequency of said divided signal applied thereto, said divided frequency further being a submultiple of said desired frequency; and wherein said sample gate further includes means for storing a value corresponding to the magnitude of said output signal during said sample time.

9. A phase lock loop, comprising:

a controlled oscillator for producing a desired signal having a certain frequency, said certain frequency being periodically corrected under the control of an error signal applied to an input of said oscillator;

means for producing a plurality of reference signals each having a reference frequency, at least two of said reference signals having different phases; and an error signal producing means for producing said error signal in response to the application thereto of said desired signal and said reference signals, said error signal correcting said certain frequency at times corresponding to the coincident application of said desired signal and each one of said plurality of reference signals.

10. The invention according to claim 9 wherein said error signal producing means includes first and second partial error signal producing means, each being responsive to the application thereto of said desired signal and a respective one of said two reference signals and each producing a portion of said error signal, each of said portions being changed at said reference frequency rate, but at a different time, and combining means for combining said two portions of said error signal into said error signal.

11. The invention according to claim 10 wherein the time at which each portion of said error signal is changed is determined by the particular phase of the reference signal applied to the means producing said portion.

12. The invention according to claim 1 wherein said reference signal dividing network comprises a ring counter.

13. The invention according to claim 4 wherein said reference signal dividing network comprises a ring counter.

14. The invention according to claim 9 wherein said means for producing a plurality of reference signals comprises a ring counter.

UNITED STATES PATENT OFFICE

CERTIFICATE OF CORRECTION

Patent No. 3,571,743 Dated March 23, 1971

Inventor(s) Elchanan Dove Menkes

It is certified that error appears in the above-identified patent and that said Letters Patent are hereby corrected as shown below:

| | |
|---|---|
| Column 2, line 8 | "K" should be --÷K-- |
| Column 2, line 10 | "K" should be --÷K-- |
| Column 2, line 11 | "N" should be --÷N-- |
| Column 2, line 15 | "fixed R" should be --fixed ÷R-- |
| Column 2, line 28 | "N" should be --÷N-- |
| Column 2, line 67 | "K" should be --÷K-- |
| Column 2, line 71 | "R" should be --÷R-- |
| Column 3, line 3 | "K" should be --÷K-- |
| Column 3, line 4 | "N" should be --÷N-- |
| Column 3, line 37 | "N" should be --÷N-- |
| Column 3, line 38 | "20" should be --÷20-- |
| Column 3, line 40 | "R" should be --÷R-- |
| Column 3, line 66 | "92" should be -72- |

UNITED STATES PATENT OFFICE
CERTIFICATE OF CORRECTION

Patent No. 3,571,743 Dated March 23, 1971

Inventor(s) Elchanan Dove Menkes

It is certified that error appears in the above-identified patent and that said Letters Patent are hereby corrected as shown below:

| | |
|---|---|
| Column 3, line 55 | "101" should be --ϕ-- |
| Column 4, line 29 | After "6f" insert --it is also noted that the effective samplii frequency-- |
| Column 5, line 20 | "corrected" should be --changed- |
| Column 5, line 30 | "corrected" should be --changed- |

Signed and sealed this 23rd day of May 1972.

(SEAL)
Attest:

EDWARD M.FLETCHER,JR.
Attesting Officer

ROBERT GOTTSCHALK
Commissioner of Patents